(12) United States Patent
Jeong et al.

(10) Patent No.: US 12,232,403 B2
(45) Date of Patent: Feb. 18, 2025

(54) DISPLAY APPARATUS

(71) Applicant: Samsung Display Co., Ltd., Yongin-si (KR)

(72) Inventors: Kwangjin Jeong, Yongin-si (KR); Daehyun Kim, Yongin-si (KR); Yeontae Kim, Yongin-si (KR); Jaehyuk Yu, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 506 days.

(21) Appl. No.: 17/701,795

(22) Filed: Mar. 23, 2022

(65) Prior Publication Data

US 2023/0058377 A1 Feb. 23, 2023

(30) Foreign Application Priority Data

Aug. 23, 2021 (KR) .................. 10-2021-0111202

(51) Int. Cl.
*H10K 59/88* (2023.01)
*H10K 59/131* (2023.01)
*H10K 77/10* (2023.01)
*H10K 102/00* (2023.01)

(52) U.S. Cl.
CPC .......... *H10K 59/88* (2023.02); *H10K 59/131* (2023.02); *H10K 77/111* (2023.02); *H10K 2102/311* (2023.02)

(58) Field of Classification Search
CPC ........... H10K 77/111; H10K 2102/311; H10K 59/88; H10K 59/131; G09F 9/301; G09G 2300/0413; G09G 2300/0426
See application file for complete search history.

(56) References Cited

U.S. PATENT DOCUMENTS

| | | |
|---|---|---|
| 7,629,691 B2 | 12/2009 | Roush et al. |
| 9,287,342 B2 | 3/2016 | Kwon et al. |
| 9,760,125 B2 | 9/2017 | Kim et al. |
| 2014/0042406 A1 | 2/2014 | Degner et al. |
| 2017/0042047 A1 | 2/2017 | Oh |

(Continued)

FOREIGN PATENT DOCUMENTS

| | | |
|---|---|---|
| KR | 10-1131178 B1 | 3/2012 |
| KR | 1020190020535 A | 3/2019 |

(Continued)

*Primary Examiner* — Wasiul Haider
(74) *Attorney, Agent, or Firm* — CANTOR COLBURN LLP

(57) ABSTRACT

A display apparatus includes a substrate including a first area, a second area, and a bending area between the first area and the second area, the substrate being bendable around a bending axis, an inorganic insulating layer on the substrate and defining an opening portion corresponding to the bending area, a lower organic material layer filling the opening portion, and a conductive layer extending from the first area to the second area, through the bending area, and on the lower organic material layer. The conductive layer includes a connection wire including a first corner portion curved at one side of a first axis of the connection wire which is crossing to the bending axis and a second corner portion curved at another side of the first axis, and a plurality of dummy patterns corresponding to the first corner portion and the second corner portion.

20 Claims, 13 Drawing Sheets

(56) References Cited

U.S. PATENT DOCUMENTS

2017/0075464 A1    3/2017  Ahn
2020/0212356 A1*   7/2020  Kim .................... H10K 59/131

FOREIGN PATENT DOCUMENTS

| KR | 1020190071283 A | 6/2019 |
| KR | 10-2076666 B1 | 2/2020 |
| KR | 10-2195459 B1 | 12/2020 |

* cited by examiner

DISPLAY APPARATUS

This application claims priority to Korean Patent Application No. 10-2021-0111202, filed on Aug. 23, 2021, and all the benefits accruing therefrom under 35 U.S.C. § 119, the disclosure of which is incorporated by reference herein in its entirety.

BACKGROUND

1. Field

One or more embodiments relate to a display apparatus, and more particularly, to a display apparatus in which a bending area reduces cracks in wiring.

2. Description of the Related Art

Among display apparatuses, organic light-emitting display apparatuses have received much attention because of their wide viewing angle, high contrast ratio, and fast response time.

In general, an organic light-emitting display apparatus includes a thin-film transistor on a substrate and an organic light-emitting diode as a display element, and the organic light-emitting diode operates by self-emitting light. Such an organic light-emitting display apparatus may be used as a display for a small electronic product, such as a mobile phone, or may be used as a display for a large electronic product, such as a television.

SUMMARY

One or more embodiments include a display apparatus in which a bending area reduces cracks in wiring. However, such a technical problem is merely an example, and the disclosure is not limited thereto.

Additional features will be set forth in part in the description which follows and, in part, will be apparent from the description, or may be learned by practice of the presented embodiments of the disclosure.

According to one or more embodiments, a display apparatus includes a substrate including a first area, a second area, and a bending area between the first area and the second area, the substrate being bendable around a bending axis, an inorganic insulating layer on the substrate and defining an opening portion corresponding to the bending area, a lower organic material layer filling the opening portion, and a conductive layer extending from the first area to the second area, through the bending area and on the lower organic material layer. The conductive layer includes a connection wire including a first corner portion curved at one side of a first axis of the connection wire crossing the bending axis and a second corner portion curved at another side of the first axis, and a plurality of dummy patterns corresponding to the first corner portion and the second corner portion.

The connection wire may surround at least a portion of each of the plurality of dummy patterns.

The connection wire may be separate from the plurality of dummy patterns.

A first end of the connection wire in a direction toward a center of the first area and a second end of the connection wire in a direction from the first area to the second area, may be on the inorganic insulating layer.

The connection wire may include a plurality of curve points at which a tangent line is parallel to the first axis, where a center of each of the plurality of dummy patterns may be spaced apart from each of the plurality of curve points by a distance.

The center of each of the plurality of dummy patterns may be on the first axis.

The plurality of dummy patterns may include a first dummy pattern on an inner side of a curve of the first corner portion and a second dummy pattern on an inner side of a curve of the second corner portion, where a center of the first dummy pattern and a center of the second dummy pattern may be misaligned with each other with respect to the first axis.

Each of the plurality of dummy patterns may have a first width in a direction perpendicular to the bending axis and a second width in a direction parallel to the bending axis, where the first width may be less than the second width.

The plurality of dummy patterns may each have an elliptical shape.

The plurality of dummy patterns may each have a rhombus shape.

The connection wire may include a plurality of connection wires, where a first connection wire may surround a portion of each of a plurality of first dummy patterns on one side of the first connection wire, a second connection wire may be on one side of the plurality of first dummy patterns, may not overlap the first connection wire and may surround a remaining portion of each of the plurality of first dummy patterns.

The first connection wire and the second connection wire may be symmetrical with respect to a central axis connecting centers of the plurality of first dummy patterns.

The display apparatus may further include a thin-film transistor over the first area, where the thin-film transistor may include a semiconductor layer, a gate electrode at least partially overlapping the semiconductor layer, and an electrode layer above the gate electrode, where the conductive layer may include the same material as a material of the electrode layer.

The display apparatus may further include a planarization layer over the first area and including a first planarization insulating layer and a second planarization insulating layer which is on the first planarization insulating layer, where the lower organic material layer may include the same material as a material of the first planarization insulating layer.

The display apparatus may further include an upper organic material layer on the conductive layer to cover the connection wire and including at least one organic film.

The display apparatus may further include a planarization layer over the first area and including a first planarization insulating layer and a second planarization insulating layer which is on the first planarization insulating layer, where the at least one organic film may include the same material as a material of the second planarization insulating layer.

The display apparatus may further include a pixel-defining layer over the first area and defining an emission area through an opening, where the at least one organic film may include the same material as a material of the pixel-defining layer.

The display apparatus may further include a spacer on the pixel-defining layer, where the at least one organic film may include the same material as a material of the spacer.

The display apparatus may further include a display element over the first area, a first optical function layer above the display element and defining an opening corresponding to the display element, and a second optical function layer on the first optical function layer and having a refractive index different from a refractive index of the first optical function layer, where the second optical function layer may extend from the first area to the second area, through the bending area.

According to one or more embodiments, a display apparatus includes a substrate including a first area, a second area, and a bending area between the first area and the second area, the substrate being bendable around a bending axis, an inorganic insulating layer on the substrate and defining an opening portion corresponding to the bending area, a lower organic material layer filling the opening portion, a connection wire on the lower organic material layer, extending from the first area to the second area through the bending area, and including a first corner portion curved at one side of a first axis perpendicular to the bending axis and a second corner portion curved at another side of the first axis, and a plurality of dummy patterns including a first dummy pattern on an inner side of a curve of the first corner portion and a second dummy pattern on an inner side of a curve of the second corner portion, where the plurality of dummy patterns include the same material as a material of the connection wire.

BRIEF DESCRIPTION OF THE DRAWINGS

The above and other features, and advantages of embodiments of the disclosure will be more apparent from the following description taken in conjunction with the accompanying drawings, in which.

DETAILED DESCRIPTION

Figure 1:
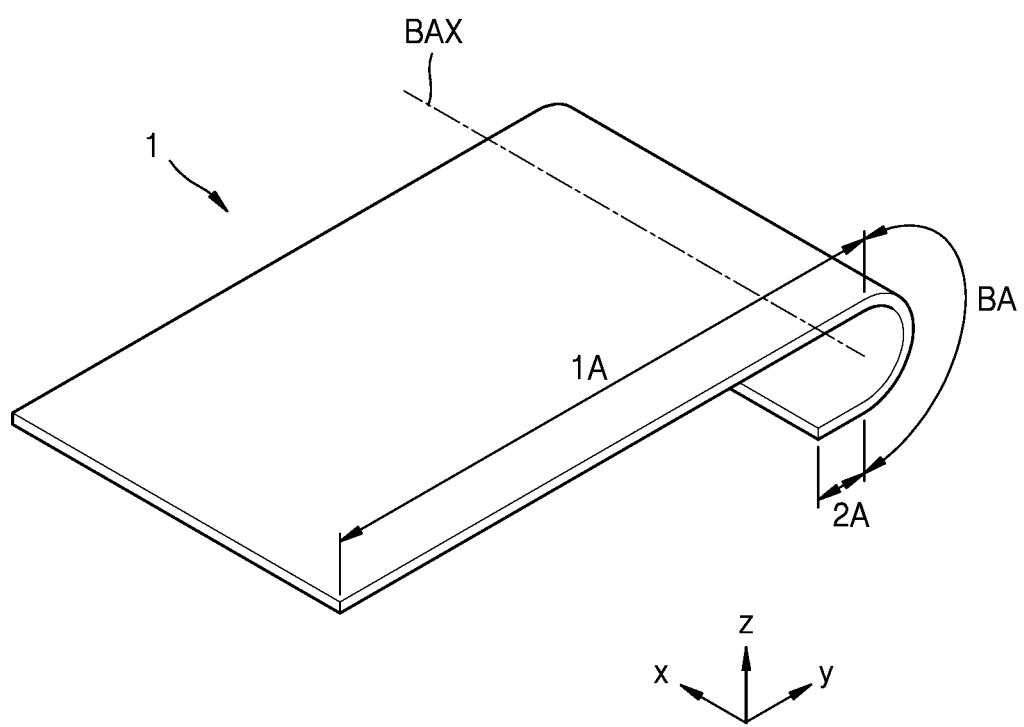
FIG. 1 is a schematic perspective view of an embodiment of a portion of a display apparatus.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain features and advantages of the present description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. As used herein, "a", "an," "the," and "at least one" do not denote a limitation of quantity, and are intended to include both the singular and plural, unless the context clearly indicates otherwise.

As the present description allows for various changes and numerous embodiments, embodiments will be illustrated in the drawings and described in the written description. Effects and features of one or more embodiments and methods of accomplishing the same will become apparent from the following detailed description of the one or more embodiments, taken in conjunction with the accompanying drawings. However, the present embodiments may have different forms and should not be construed as being limited to the descriptions set forth herein.

One or more embodiments will be described below in more detail with reference to the accompanying drawings. Those elements that are the same or are in correspondence with each other are rendered the same reference numeral regardless of the figure number, and redundant descriptions thereof are omitted.

While such terms as "first" and "second" may be used to describe various elements, such elements must not be limited to the above terms. The above terms are used only to distinguish one element from another.

The singular forms "a," "an," and "the" as used herein are intended to include the plural forms as well unless the context clearly indicates otherwise. As used herein, a reference number may indicate a singular element or a plurality of the element. For example, a reference number labeling a singular form of an element within the drawing figures may be used to reference a plurality of the singular element within the text of specification.

It will be understood that the terms "include," "comprise," and "have" as used herein specify the presence of stated features or elements but do not preclude the addition of one or more other features or elements.

It will be further understood that, when a layer, region, or element is referred to as being related to another element such as being "on" another layer, region, or element, it may be directly or indirectly on the other layer, region, or element. That is, for example, intervening layers, regions, or elements may be present. In contrast, when a layer, region, or element is referred to as being related to another element such as being "directly on" another layer, region, or element, no intervening layer, region, or element is present therebetween.

It will be further understood that, when layers, regions, or elements are referred to as being connected to each other, they may be directly connected to each other or may be indirectly connected to each other with intervening layers, regions, or elements therebetween. For example, when layers, regions, or elements are referred to as being electrically connected to each other, they may be directly electrically connected to each other or may be indirectly electrically connected to each other with intervening layers, regions, or elements therebetween.

As used herein, the expression "A and/or B" refers to A, B, or A and B. In addition, the expression "at least one of A and B" refers to A, B, or A and B.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

When an embodiment may be implemented differently, a process order may be performed differently from the described order. For example, two consecutively described processes may be performed substantially at the same time or performed in an order opposite to the described order.

Sizes of elements in the drawings may be exaggerated or reduced for convenience of explanation. For example, since sizes and thicknesses of elements in the drawings are arbitrarily illustrated for convenience of explanation, the following embodiments are not limited thereto.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
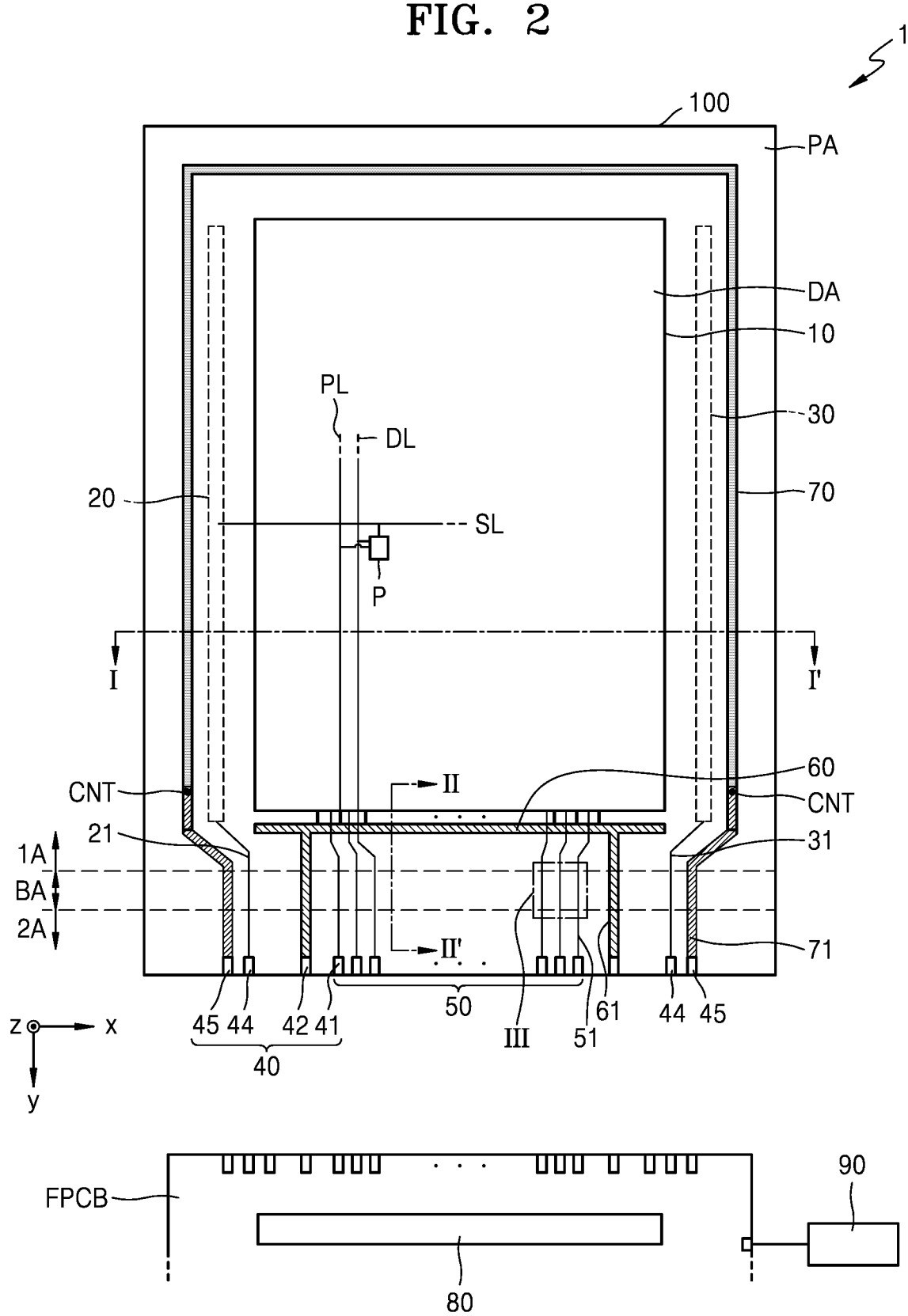
FIG. 2 is a schematic plan view of an embodiment of a portion of the display apparatus of FIG. 1 which is unbent.

FIG. 1 is a schematic perspective view of an embodiment of a portion of a display apparatus 1. FIG. 2 is a schematic plan view of an embodiment of a portion of a structure of the display apparatus 1 of FIG. 1, which is unbent (or flat).

Referring to FIGS. 1 and 2, a substrate 100 included in the display apparatus 1 has a bending area BA between a first area 1A and a second area 2A. In a first direction (a direction +y) crossing a second direction (a direction +x), the bending area BA is between the first area 1A and the second area 2A. As shown in FIG. 1, the substrate 100 is bent around a bending axis BAX extending in one direction (the direction +x). Various components and layers of the display apparatus 1 may have a bending area BA, a first area 1A and a second area 2A corresponding to those described above. Various components and layers of the display apparatus 1 may be flexible (e.g., bendable, foldable, rollable) at the bending area BA. The flexible components and layers may be variously bendable, foldable, rollable, etc. together with each other.

The substrate 100 may include various materials having flexible or bendable properties. In an embodiment, for example, the substrate 100 may include polymer resin such as polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

A display area DA is included in the first area 1A. That is, as shown in FIG. 2, the first area 1A includes the display area DA and a portion of a peripheral area PA which is adjacent to the display area DA, such as being around the display area DA. The peripheral area PA includes a partial region of the first area 1A minus the display area DA, the bending area BA, and the second area 2A.

Referring to FIG. 2, the display apparatus 1 includes a display unit 10 on the substrate 100. The display unit 10 includes pixels P connected to each of a scan line SL extending in a direction x and to a data line DL extending in a direction y which crosses the direction x. The display unit 10 provides an image with light emitted from the pixels P and defines (or corresponds to) the display area DA. A thickness direction of the display apparatus 1 and various components or layers thereof may be taken along a third direction (e.g., direction z) which crosses each of the direction x and the direction y.

Each pixel P may emit, for example, red, green, blue, or white light. Each pixel P includes a display element, and the display element may include an organic light-emitting diode OLED. A pixel P described herein refers to a display pixel that emits light of which the color is one of red, green, blue, and white as described above.

The peripheral area PA is arranged outside the display area DA and closer to an outer edge of the substrate 100 than the display area DA. In an embodiment, for example, the peripheral area PA may surround the display area DA. The peripheral area PA, which is an area where the pixels P are not arranged or omitted, corresponds to a non-display area that provides no image. In the present embodiment, the bending area BA may be defined as a portion of the peripheral area PA, and accordingly, the bending area BA may be a non-display area that provides no image.

A drive circuit, for example, first and second scan drive circuits 20 and 30, a pad portion 40, a driving voltage supply wire 60, and a common voltage supply wire 70, may be arranged in the peripheral area PA.

The first and second scan drive circuits 20 and 30 are arranged in the peripheral area PA of the substrate 100, and generate and transmit an electrical signal such as a scan signal Sn to each pixel P via the scan line SL. In an embodiment, for example, although the first scan drive circuit 20 may be on a left side of the display unit 10 in a plan view, and the second scan drive circuit 30 may be on a right side of the display unit 10, the disclosure is not limited thereto. In some embodiments, only one scan drive circuit may be provided.

The pad portion 40 is arranged at an end portion of the substrate 100, and includes a plurality of pads 41, 42, 44, and 45. The pad portion 40 may not be covered by an insulating layer to be exposed, and thus, may be electrically connected to a flexible printed circuit board FPCB. The pad portion 40 may be on a side of the substrate 100 where the first and second scan drive circuits 20 and 30 are not located. A plurality of pads 41 may be included in a data pad portion 50.

The flexible printed circuit board FPCB electrically connects a controller 90 and the pad portion 40 to each other. A signal or power transmitted from the controller 90 moves through via wires 21, 31, 51, 61, and 71 which are connected to the pad portion 40.

The controller 90 may receive various electrical signals such as a vertical synchronization signal, a horizontal synchronization signal and a clock signal, and may generate an electrical such as a control signal for controlling driving of the first and second scan drive circuits 20 and 30. The generated signal may be transmitted to each of the first and second scan drive circuits 20 and 30 via the pad 44 connected between the flexible printed circuit board FPCB and the wires 21 and 31. A scan signal Sn of the first and second scan drive circuits 20 and 30 may be provided to each pixel P via the scan line SL. In addition, the controller 90 provides a driving voltage ELVDD and a common voltage ELVSS to the driving voltage supply wire 60 and the common voltage supply wire 70, respectively, via the pads 42 and 45 connected between the flexible printed circuit board FPCB and the wires 61 and 71. The driving voltage ELVDD may be provided to each pixel P via a driving voltage line PL, and the common voltage ELVSS may be provided to a common electrode of the pixel P.

A data drive circuit 80 may be on the flexible printed circuit board FPCB. The data drive circuit 80 provides a data signal Dm to each pixel P. The data signal Dm of the data drive circuit 80 is provided to each pixel P via the wire 51 connected to the pad 41 and the data line DL connected to the wire 51. Although FIG. 2 shows the data drive circuit 80 on the flexible printed circuit board FPCB, the disclosure is not limited thereto. In some embodiments, the data drive circuit 80 may be on the peripheral area PA of the substrate 100.

The driving voltage supply wire 60 may be on the peripheral area PA. In an embodiment, for example, the driving voltage supply wire 60 may be between one side of the display unit 10 adjacent to the pad portion 40, and the pad portion 40. The driving voltage ELVDD provided via the wire 61 connected to the pad 42 may be provided to each pixel P via the driving voltage line PL.

The common voltage supply wire 70 may be in the peripheral area PA and may partially surround the display unit 10. In an embodiment, for example, the common voltage supply wire 70 may be in the form of a loop having an open side at a side of the display unit 10 which is adjacent to (e.g., closest to) the pad portion 40, and may extend along edges (e.g., outer edges) of the substrate 100 except for an edge closest to the pad portion 40.

The common voltage supply wire 70 of FIG. 2 is electrically connected to the wire 71 connected to the pad 45, and provides the common voltage ELVSS to an opposite electrode 230 (e.g., a cathode) of an organic light-emitting diode OLED of the pixel P. The common voltage supply wire 70 of FIG. 2 is in the form of a loop having one side open, which partially surrounds the display unit 10, and partially overlaps the wire 71 connected to the pad 45. The wire 71 connected to the pad 45, and the common voltage supply wire 70, may be connected to each other via a contact hole CNT in an insulating layer therebetween, for example, an inorganic insulating layer. A connection area of the wire 71 connected to the pad 45, and the common voltage supply wire 70, that is, the contact hole CNT, may be an area adjacent to one side of the display unit 10 facing the pad portion 40. The wire 71 connected to the pad 45, and the common voltage supply wire 70, may overlap each other at the contact hole CNT to define an overlapping area. In some embodiments, the wire 71 connected to the pad 45 may not be separately provided from the common voltage supply wire 70, and the common voltage supply wire 70 may instead be directly connected to the pad 45.

Although not shown, a thin film encapsulation portion (not shown) externally encapsulating the display unit 10 may be further provided on the display unit 10. The thin film encapsulation portion (not shown) may be a multilayer in which one or more of each of an inorganic layer and an organic layer are alternately stacked. The thin-film encapsulation unit (not shown) may cover the display unit 10 and circuit units (e.g., the first and second drive circuits 20 and 30, and the common voltage supply wire 70) on the peripheral area PA, and may extend to the edges (e.g., outer edges) of the substrate 100.

Figure 3A:
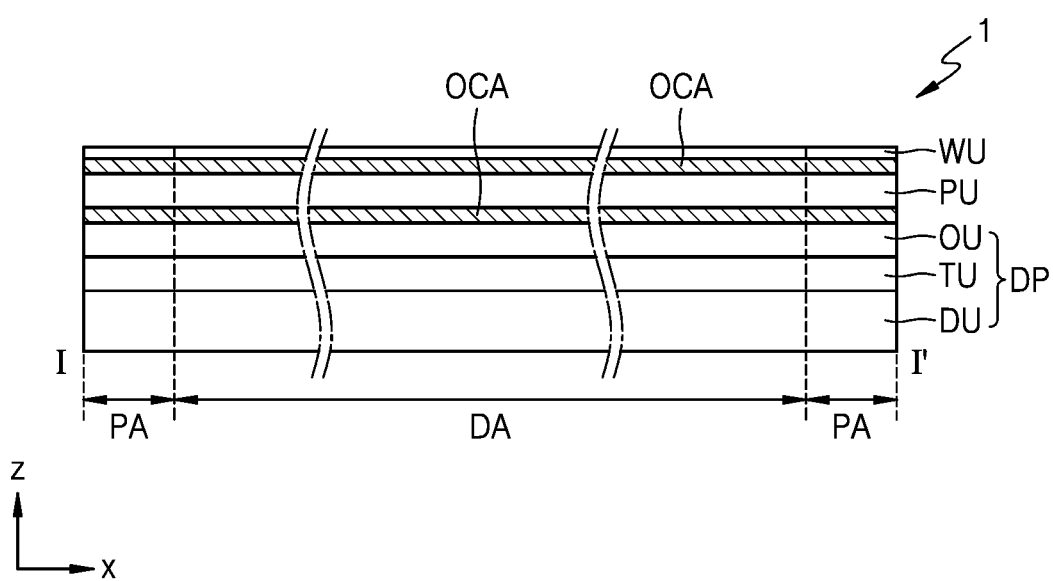
FIGS. 3A and 3B are schematic cross-sectional views of embodiments of the display apparatus of FIG. 2, taken along line I-I' of FIG. 2.
Figure 3B:
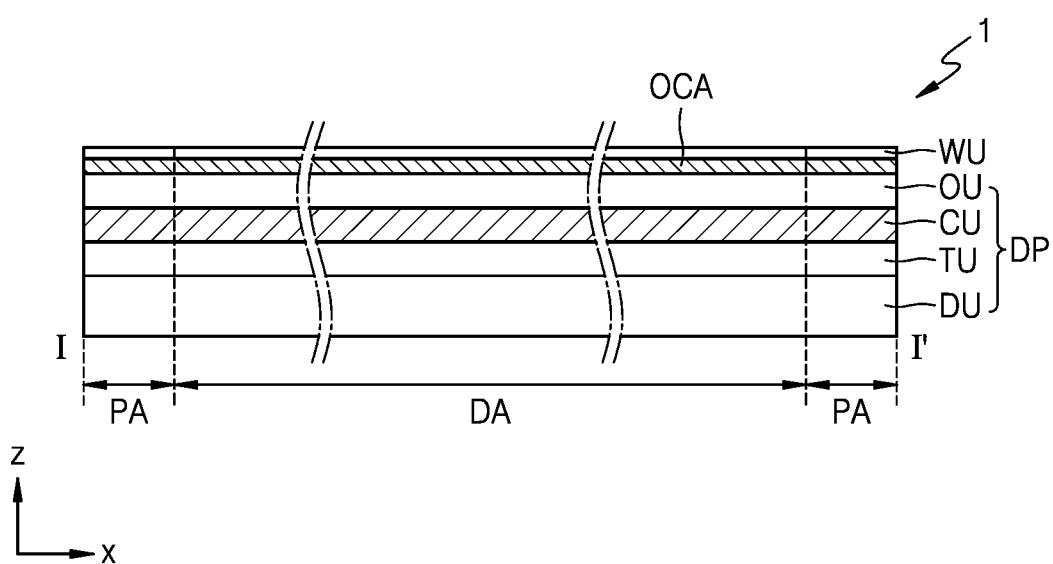

FIGS. 3A and 3B are schematic cross-sectional views of embodiments of the display apparatus 1 of FIG. 2, taken along line I-I' of FIG. 2.

Referring to FIG. 3A, the display apparatus 1 may include a display layer DU, an input sensing layer TU, an optical function layer OU, an anti-reflection layer PU, and a window layer WU. At least some of the display layer DU, the input sensing layer TU, the optical function layer OU, the anti-reflection layer PU, and the window layer WU may be formed (or provided) by consecutive processes, or at least some thereof may be coupled to each other through an adhesive member. FIG. 3A shows an optically clear adhesive member OCA as an example of the adhesive member. The adhesive member described below may include an ordinary adhesive or pressure-sensitive adhesive. In an embodiment, the anti-reflection layer PU and the window layer WU may be replaced with other configurations or may be omitted.

In an embodiment, the input sensing layer TU is directly arranged on the display layer DU. In the present description, the reference "configuration B is directly arranged on configuration A" means that an intervening member such as a separate adhesive layer/adhesive member is not between the configuration A and the configuration B. The reference "configuration B is formed on a base surface" means that the configuration B is provided through consecutive processes after the configuration A is formed and may include no intervening member therebetween. As used herein, elements which are "directly" related to each other, formed through consecutive processes, have no intervening member therebetween, etc. may form an interface therebetween, without being limited thereto.

The display unit DU, the input sensing layer TU directly arranged on the display unit DU, and the optical function layer OU, may be collectively defined as a display panel DP. In an embodiment, as shown in FIG. 3A, an optically clear adhesive member OCA may be between the display panel DP and the anti-reflection layer PU and between the anti-reflection layer PU and the window layer WU.

In some embodiments, as shown in FIG. 3B, the display panel DP may include an anti-reflection layer CU. The anti-reflection layer CU may be between the input sensing layer TU and the optical function layer OU. The anti-reflection layer CU may include a color filter corresponding to an emission area of each pixel P, and a light-blocking layer corresponding to a non-emission area between pixels P. In an embodiment, the optically clear adhesive member OCA may not be between the anti-reflection layer CU and the display panel DP, and the anti-reflection layer CU may be directly arranged on the display panel DP.

The display layer DU generates an image, and the input sensing layer TU obtains coordinate information of an external input (e.g., a touch event). Although not shown, the display panel DP may further include a protection member under the display layer DU. The protection member and the display layer DU may be coupled to each other through an adhesive member.

The optical function layer OU may improve luminance efficiency. The optical function layer OU may improve, for example, front luminance efficiency and/or lateral visibility of light emitted from the organic light-emitting diode OLED.

The anti-reflection layer PU reduces reflectance of external light incident on the window layer WU. The anti-reflection layer PU may include a retarder and a polarizer. The retarder may be a film type or liquid crystal coating type retarder, and may include a λ/2 retarder and/or a λ/4 retarder. The polarizer may also be a film type or liquid crystal coating type polarizer. The film type polarizer may include a stretchable synthetic resin film, and the liquid crystal coating type polarizer may include liquid crystals in an arrangement. The retarder and the polarizer may further include a protective film. The retarder and the polarizer themselves, or the protective film may be defined as a base layer of the anti-reflection layer PU.

Figure 4:
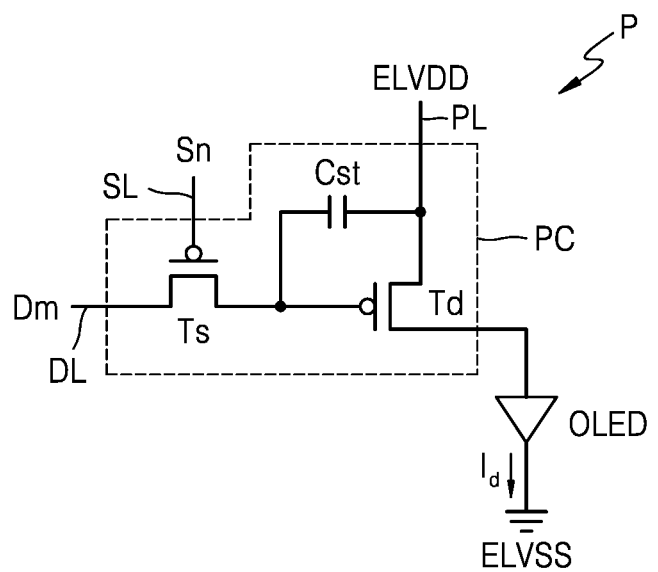
FIG. 4 is an equivalent circuit diagram of an embodiment of a pixel of a display apparatus.

FIG. 4 is an equivalent circuit diagram of an embodiment of the pixel P of a display apparatus 1.

Referring to FIG. 4, each pixel P includes a pixel circuit PC connected to the scan line SL and the data line DL, and an organic light-emitting diode OLED as a display element which is connected to the pixel circuit PC.

The pixel circuit PC includes a driving thin-film transistor Td, a switching thin-film transistor Ts, and a storage capacitor Cst. The switching thin-film transistor Ts is connected to the scan line SL and the data line DL, and transmits a data signal Dm input via the data line DL to the driving thin-film transistor Td, according to a scan signal Sn input via the scan line SL.

The storage capacitor Cst is connected to the switching thin-film transistor Ts and the driving voltage line PL, and stores a voltage corresponding to a difference between a voltage received from the switching thin-film transistor Ts and the driving voltage ELVDD supplied to the driving voltage line PL.

The driving thin-film transistor Td is connected to the driving voltage line PL and the storage capacitor Cst, and may control a driving current $I_d$ flowing through the organic light-emitting diode OLED from the driving voltage line PL, in response to a voltage value stored in the storage capacitor Cst. Due to the driving current $I_d$, the organic light-emitting diode OLED may emit light having a brightness.

Although a case in which the pixel circuit PC includes two thin-film transistors and one storage capacitor has been described with reference to FIG. 4, the disclosure is not limited thereto. In some embodiments, the pixel circuit PC may include seven thin-film transistors and one storage capacitor. In some embodiments, the pixel circuit PC may include two or more storage capacitors.

Figure 5:
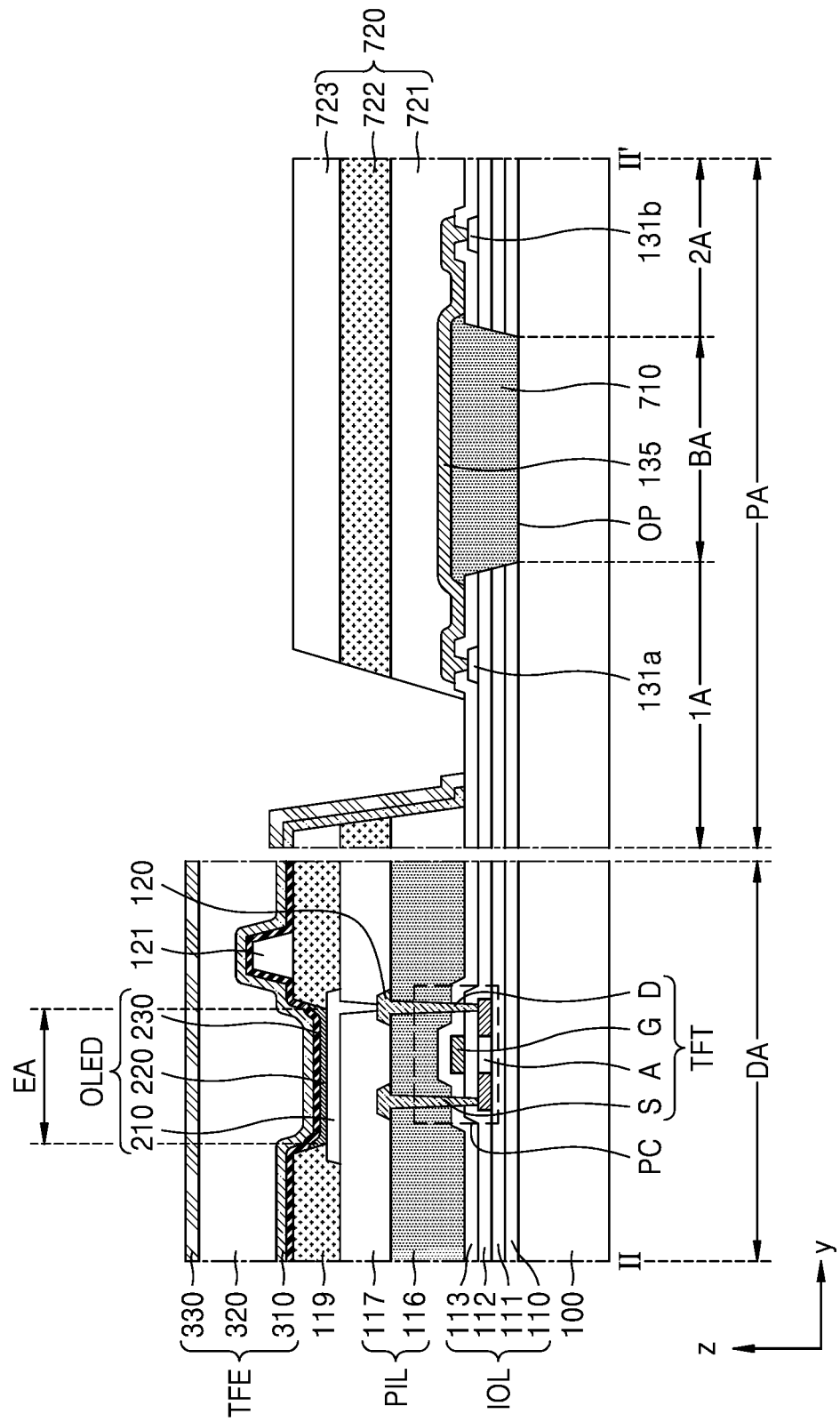
FIG. 5 is a schematic cross-sectional view of the display apparatus of FIG. 2, taken along line II-II' of FIG. 2.

FIG. 5 is a schematic cross-sectional view of an embodiment of the display apparatus 1 of FIG. 2, taken along line II-II' of FIG. 2.

In FIG. 5, for convenience of description, the input sensing layer TU (refer to FIGS. 3A and 3B), the optical function layer OU, the anti-reflection layer PU, and the window layer WU are omitted, and only the display layer DU is shown. The display layer DU includes light-emitting diodes arranged on the substrate 100 to correspond to the display area DA, and in this regard, FIG. 5 shows one light-emitting diode, for example, the organic light-emitting diode OLED.

First, a structure at the display area DA will be described with reference to FIG. 5. As described above, the display area DA is included in the first area 1A.

A barrier layer 110 may be on the substrate 100. A buffer layer 111 may be on the barrier layer 110. The buffer layer 111 may prevent (or effectively reduce) impurities from penetrating into various devices arranged on the substrate 100 through the substrate 100.

The pixel circuit PC including a thin-film transistor TFT may be on the buffer layer 111. The thin-film transistor TFT may include a semiconductor layer A, a gate electrode G overlapping a channel region of the semiconductor layer A, and an electrode layer 120 above the gate electrode G. The electrode layer 120 may include a source electrode S and a drain electrode D connected to a source region and a drain region of the semiconductor layer A, respectively. A gate insulating layer 112 may be between the semiconductor layer A and the gate electrode G, and a first interlayer insulating layer 113 and a first planarization insulating layer 116 may be between the gate electrode G and the electrode layer 120.

The semiconductor layer A may include a channel region, and source and drain regions doped with impurities. In an embodiment, the semiconductor layer A may include a silicon semiconductor material. In an embodiment, the semiconductor layer A may include polysilicon or amorphous silicon. In an embodiment, the semiconductor layer A may include an oxide semiconductor material. In an embodiment, a plurality of thin-film transistors TFT may be included in the pixel circuit PC, and some of the plurality of thin-film transistors TFT may include a silicon semiconductor material, and the other thin-film transistors TFT may include an oxide semiconductor material. When the semiconductor layer A includes an oxide semiconductor material, the semiconductor layer A may include, for example, oxide of at least one material selected from the group including indium (In), gallium (Ga), tin (Sn), zirconium (Zr), hafnium (Hf), titanium (TI), and zinc (Zn).

The gate insulating layer 112 may include an inorganic insulating material such as silicon oxide, silicon oxynitride and/or silicon nitride, and may have a single-layer or multi-layer structure including the material described above.

The gate electrode G may include a low-resistance conductive material such as molybdenum (Mo), aluminum (Al), copper (Cu) and/or titanium (Ti), and may have a single-layer or multi-layer structure including the material described above.

The first interlayer insulating layer 113 may include an inorganic insulating material such as silicon oxide, silicon oxynitride and/or silicon nitride, and may have a single-layer or multi-layer structure including the material described above.

The electrode layer 120 may include aluminum (Al), molybdenum (Mo), titanium (Ti), tungsten (W) and/or copper (Cu), and may have a single-layer or multi-layer structure including the material described above. In an embodiment, for example, the electrode layer 120 may have a three-layer structure of titanium layer/aluminum layer/titanium layer.

A planarization layer PIL may be on the pixel circuit PC. The planarization layer PIL may include a material different from that of at least one layer within the inorganic insulating layer IOL, for example, the barrier layer 110, the buffer layer 111, the gate insulating layer 112, and the first interlayer insulating layer 113.

The planarization layer PIL may include the first planarization insulating layer 116 and a second planarization insulating layer 117. The first planarization insulating layer 116 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_x$).

The second planarization insulating layer 117 may be on the first planarization insulating layer 116. The second planarization insulating layer 117 may include an organic insulating material such as acrylic, benzocyclobutene (BCB), PI, or hexamethyldisiloxane (HMDSO). As described above, the electrode layer 120 may be on the first planarization insulating layer 116, and a pixel electrode 210 may be electrically connected to the thin-film transistor TFT through the electrode layer 120.

The pixel electrode 210 may be on the second planarization insulating layer 117. The pixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. The pixel electrode 210 may include a reflective film including the material described above and a transparent conductive film on and/or under the reflective film. The transparent conductive film may include indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 210 may have a three-layer structure of ITO layer/Ag layer/ITO layer, which are sequentially stacked.

The pixel-defining layer 119 may cover edges of the pixel electrode 210 and may include (or define) an opening exposing a center of the pixel electrode 210 to outside the pixel-defining layer 119. The pixel-defining layer 119 may include an organic insulating material such as BCB, PI, or HMDSO. An emission area EA (e.g., light emission area) may be defined by the opening of the pixel-defining layer 119, and red, green, or blue light may be emitted at the emission area EA. In a direction along the substrate 100, an area or width of the emission area EA may define an area or width of a pixel P.

A spacer 121 may be on the pixel-defining layer 119. The spacer 121 may prevent damage to layers under the spacer 121 due to a mask, during a process of forming an intermediate layer 220, etc. to be described below. In an embodiment, the spacer 121 may include the same material as that of the pixel-defining layer 119 or may include a material different from that of the pixel-defining layer 119. In an embodiment, for example, when the spacer 121 includes the same material as that of the pixel-defining layer 119, the spacer 121 and the pixel-defining layer 119 may be integrally formed with each other, such as through a half-tone mask.

The pixel-defining layer 119 may be black. The pixel-defining layer 119 may include a light-blocking material and may be black. The light-blocking material may include carbon black, carbon nanotubes, resin or paste including black pigments, metal particles of, for example, Ni, Al, Mo, and alloys thereof, metal oxide particles (e.g., Cr oxide particles), or metal nitride particles (e.g., Cr nitride particles). When the pixel-defining layer 119 includes a light-blocking material, external reflection by metal structures arranged under the pixel-defining layer 119 may be reduced.

As described above, when the spacer 121 includes the same material as that of the pixel-defining layer 119, the spacer 121 and the pixel-defining layer 119 may be integrally formed with each other through a half-tone mask. Accordingly, when the pixel-defining layer 119 is black, the spacer 121 may also be black.

The intermediate layer 220 includes an emission layer overlapping the pixel electrode 210. The emission layer may include an organic material. The emission layer may include a polymer organic material or low-molecular weight organic material emitting light of a color. As described above, the emission layer may be formed through a deposition process using a mask.

A first functional layer and a second functional layer (not shown) may be arranged under and/or on the emission layer, respectively. In an embodiment, while the emission layer is patterned and arranged for each pixel P, the first functional layer and the second functional layer may be integrally provided over an entire surface of the display area DA.

The first functional layer may have a single-layer or multi-layer structure. In an embodiment, for example, when the first functional layer includes a polymer material, the first functional layer may be a hole transport layer (HTL) having a single-layer structure, and may include poly(3,4-ethylenedioxythiophene) (PEDOT) or polyaniline (PANI). When the first functional layer includes a low-molecular weight material, the first functional layer may include a hole injection layer (HIL) and an HTL.

The second functional layer may be optional. In an embodiment, for example, when the first functional layer and the emission layer include a polymer material, the second functional layer may be formed. The second functional layer may have a single-layer or multi-layer structure. The second functional layer may include an electron transport layer (ETL) and/or an electron injection layer (EIL).

The opposite electrode 230 may include a conductive material with a relatively low work function. In an embodiment, for example, the opposite electrode 230 may include a (semi)transparent layer including silver (Ag), magnesium (Mg), aluminum (Al), nickel (Ni), chromium (Cr), lithium (Li), calcium (Ca), or alloys thereof. Alternatively, the opposite electrode 230 may further include a layer, such as ITO, IZO, ZnO, or $In_2O_3$, on a (semi)transparent layer including the material described above. In an embodiment, the opposite electrode 230 may include silver (Ag) and magnesium (Mg).

A stacked structure of the pixel electrode 210, the intermediate layer 220, and the opposite electrode 230, which are sequential in a direction away from the substrate 100, may together constitute a light-emitting diode as a, for example, the organic light-emitting diode OLED. A display layer including the pixel circuit PC, insulating layers, and the organic light-emitting diode OLED may be covered by a thin film encapsulation layer TFE.

The thin film encapsulation layer TFE may include first and second inorganic encapsulation layers 310 and 330 facing each other, and an organic encapsulation layer 320 therebetween.

Each of the first and second inorganic encapsulation layers 310 and 330 may include one or more inorganic insulating materials. The inorganic insulating material may include aluminum oxide, titanium oxide, tantalum oxide, hafnium oxide, zinc oxide, silicon oxide, silicon nitride and/or silicon oxynitride. The first and second inorganic encapsulation layers 310 and 330 may be formed through chemical vapor deposition.

The organic encapsulation layer 320 may include a polymer-based material. Examples of the polymer-based material may include acryl-based resin, epoxy-based resin, PI, and polyethylene. In an embodiment, for example, the organic encapsulation layer 320 may include acryl-based resin, for example, poly(methyl methacrylate), polyacrylic acid, etc. The organic encapsulation layer 320 may be formed by curing monomers or applying polymers.

The thin film encapsulation layer TFE may cover an entirety of the display area DA, and may extend from the display area DA to the peripheral area PA and cover a portion of the peripheral area PA. The thin film encapsulation layer TFE may extend to the peripheral area PA at the driving voltage supply wire 60 (refer to FIG. 2).

Referring to the peripheral area PA, the peripheral area PA includes a portion of the first area 1A minus the display area DA, the bending area BA, and the second area 2A.

The inorganic insulating layer IOL including the barrier layer 110, the buffer layer 111, the gate insulating layer 112, and the first interlayer insulating layer 113 may cover the display area DA and the peripheral area PA. The inorganic insulating layer IOL may include an opening portion OP corresponding to the bending area BA. In FIG. 5, the inorganic insulating layer IOL corresponding to the bending area BA has been completely removed. However, in some embodiments, part or all of the barrier layer 110 or the barrier layer 110 and the buffer layer 111 may remain at the bending area BA without being removed. In this regard, an area of the opening portion OP may be defined as a minimum area defined by an opening from among openings of the barrier layer 110, the buffer layer 111, the gate insulating layer 112, and the first interlayer insulating layer 113 constituting the inorganic insulating layer IOL. FIG. 5 shows a minimum area (or dimension) of the opening portion OP defined by the opening of the barrier layer 110. As described above, by removing part or all of the inorganic insulating layer IOL which corresponds to the bending area BA, propagation of cracks due to the inorganic insulating layer IOL may be prevented (or effectively reduced) when the substrate 100 is bent.

A lower organic material layer 710 may be arranged at the bending area BA. The lower organic material layer 710 may include the same material as that of the planarization layer PIL. In an embodiment, for example, the lower organic material layer 710 may include the same material as that of the first planarization insulating layer 116. Hereinafter, when "layer A" and "layer B" are referred to as including the same material as each other in the present description, it may mean that "layer A" and "layer B" are formed by the same process. Accordingly, when the lower organic material layer 710 includes the same material as that of the first planarization insulating layer 116, the lower organic material layer 710 and the first planarization insulating layer 116 may be formed simultaneously. As such, the lower organic material layer 710 and the first planarization insulating layer 116 may be respective patterns of a same material layer.

In an embodiment, the lower organic material layer 710 may fill at least a portion of the opening portion OP of the inorganic insulating layer IOL. FIG. 5 shows the lower organic material layer 710 completely filling the opening portion OP.

A first conductive layer 135 may be on the lower organic material layer 710. The first conductive layer 135 may extend from the first area 1A to the second area 2A, through the bending area BA. In a place where the lower organic material layer 710 is not present, the first conductive layer 135 may be on the inorganic insulating layer IOL such as on the first interlayer insulating layer 113. The first conductive layer 135 may include the same material as that of the electrode layer 120. Accordingly, the first conductive layer 135 and the electrode layer 120 may be formed simultaneously and/or be respective patterns of a same material layer.

The display apparatus 1 may include second conductive layers 131a and 131b together as a second conductive layer, in addition to the first conductive layer 135. The second conductive layers 131a and 131b are arranged in the first area 1A or the second area 2A so as to be on (or in) a different layer from the first conductive layer 135, and may be electrically connected to the first conductive layer 135. In FIG. 5, the second conductive layers 131a and 131b are shown as being formed of the same material and on the same layer as the gate electrode G of the thin-film transistor TFT, that is, on the gate insulating layer 112. In addition, the first conductive layer 135 is shown as contacting the second conductive layers 131a and 131b through a contact hole formed in the first interlayer insulating layer 113. The second conductive layer 131a in the first area 1A may be electrically connected to the thin-film transistor TFT, etc. in the display area DA, and accordingly, the first conductive layer 135 may be electrically connected to the thin-film transistor TFT, etc. in the display area DA through the second conductive layer 131a. The second conductive layer 131b in the second area 2A may also be electrically connected to the thin-film transistor TFT, etc. in the display area DA by the first conductive layer 135. In an embodiment, for example, the first conductive layer 135 may be electrically connected to the pad portion 40 (refer to FIG. 2) through the second conductive layer 131b arranged in the second area 2A.

The first conductive layer 135 may include a connection wire 135CW (refer to FIG. 6) for transmitting a data signal Dm, etc. to each pixel P, and a plurality of dummy patterns 135DE which correspond to corner or bent portions of the connection wire 135CW. Shapes and arrangements of the connection wire 135CW and the dummy patterns 135DE will be described later in detail with reference to FIGS. 6 to 8.

Referring to FIG. 5 again, an upper organic material layer 720 may be on the first conductive layer 135. The upper organic material layer 720 may include at least one organic film, for example, first to third organic films 721 to 723. Although the upper organic material layer 720 of FIG. 5 includes the first to third organic films 721 to 723, some may be omitted, or an organic film may be further included.

In an embodiment, the first organic film 721 may include the same material as that of the second planarization insulating layer 117. In an embodiment, for example, the first organic film 721 and the second planarization insulating layer 117 may be formed by the same process. The second organic film 722 may include the same material as that of the pixel-defining layer 119. In an embodiment, for example, the second organic film 722 and the pixel-defining layer 119 may be formed by the same process. The third organic film 723 may include the same material as that of the spacer 121. In an embodiment, for example, the third organic film 723 and the spacer 121 may be formed by the same process. When the pixel-defining layer 119 and the spacer 121 include the same material as each other, the spacer 121 and the pixel-defining layer 119 may be integrally formed with each other through a half-tone mask, and the second organic film 722 and the third organic film 723 may also be integrally formed with each other.

In FIG. 5, an end surface of the upper organic material layer 720 in an edge direction (the direction +y) of the substrate 100 is shown as coinciding with an edge end surface of the substrate 100 or the like. However, the disclosure is not limited thereto, and an end surface of the upper organic material layer 720 may cover the first conductive layer 135 and may be inside the substrate 100 (e.g., spaced apart from an outer edge thereof), and end surfaces of the first to third organic films 721 to 723 constituting the upper organic material layer 720 may not coincide with one another. In addition, in FIG. 5, an area in which the upper organic material layer 720 is formed may extend in a direction from a center of the opening portion OP of the inorganic insulating layer IOL to a center of the display area DA, beyond a point at which the first conductive layer 135 and the second conductive layer 131a contact each other.

Figure 6:
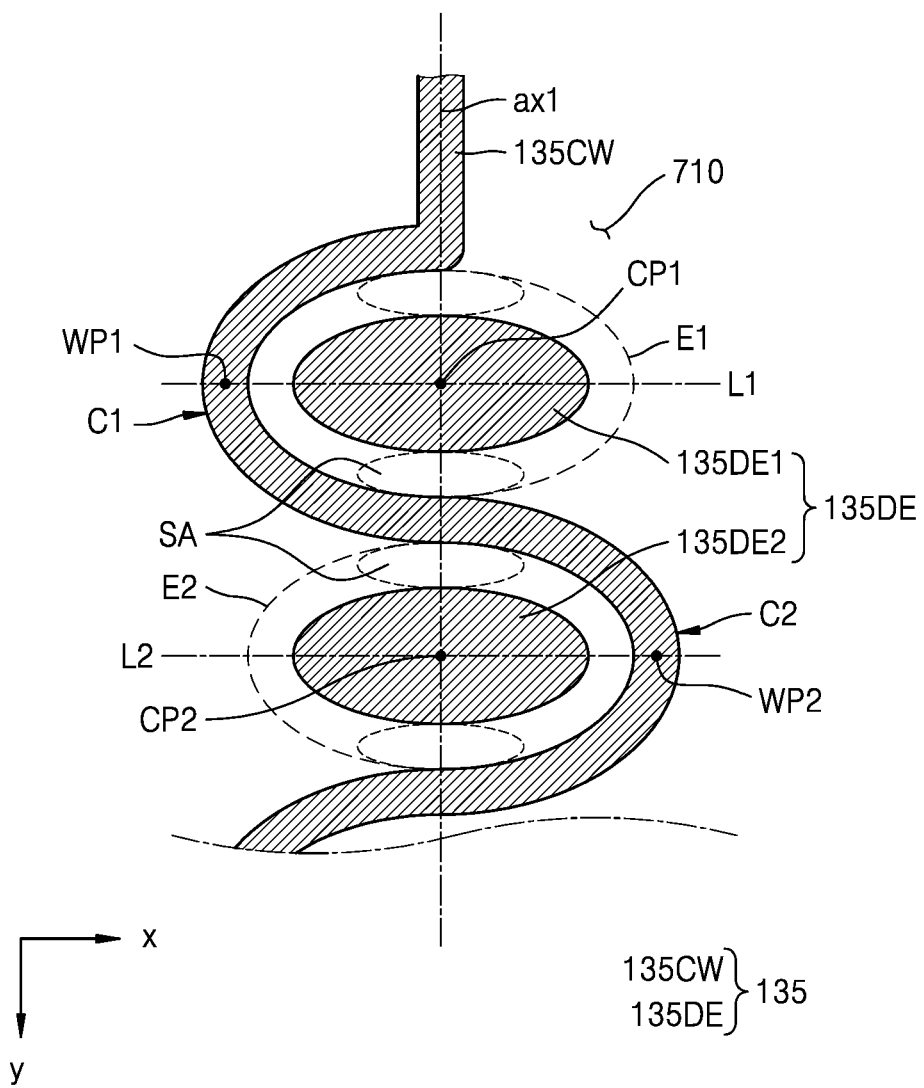
FIGS. 6 to 8 are enlarged plan views schematically showing embodiments of a portion of a display apparatus.
Figure 7:
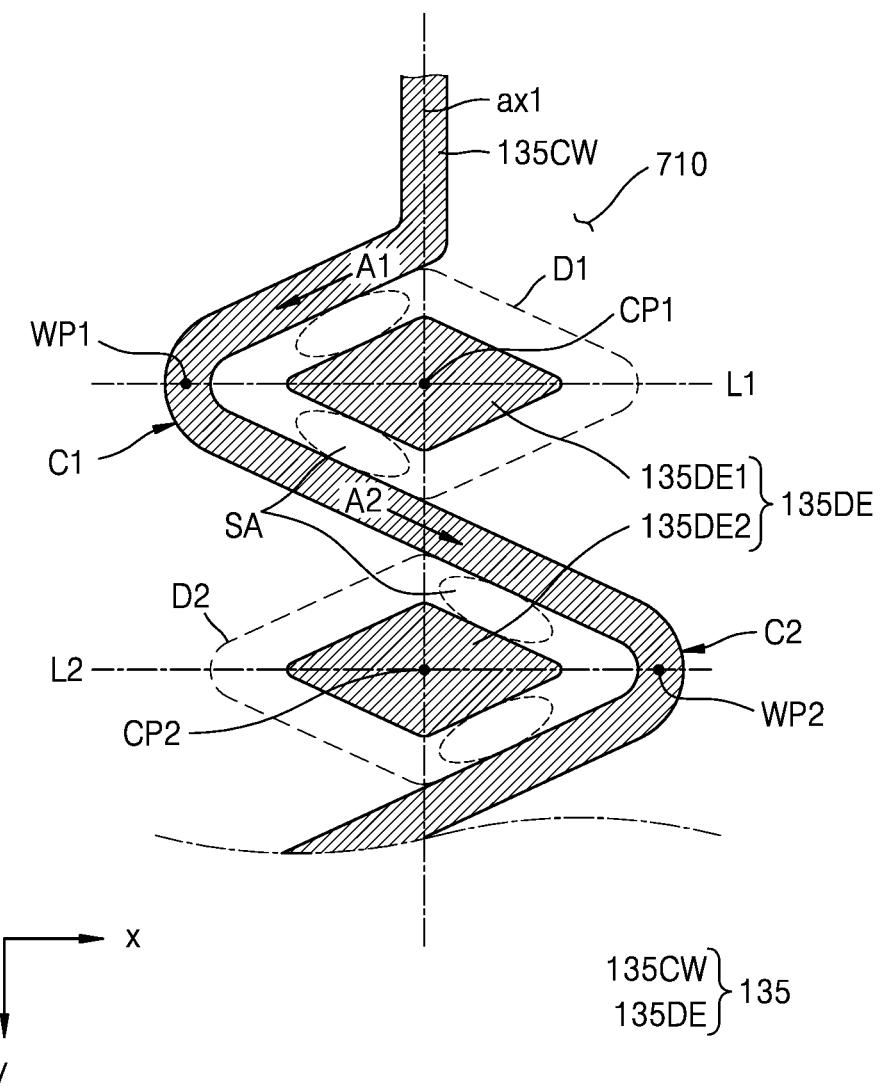
Figure 8:
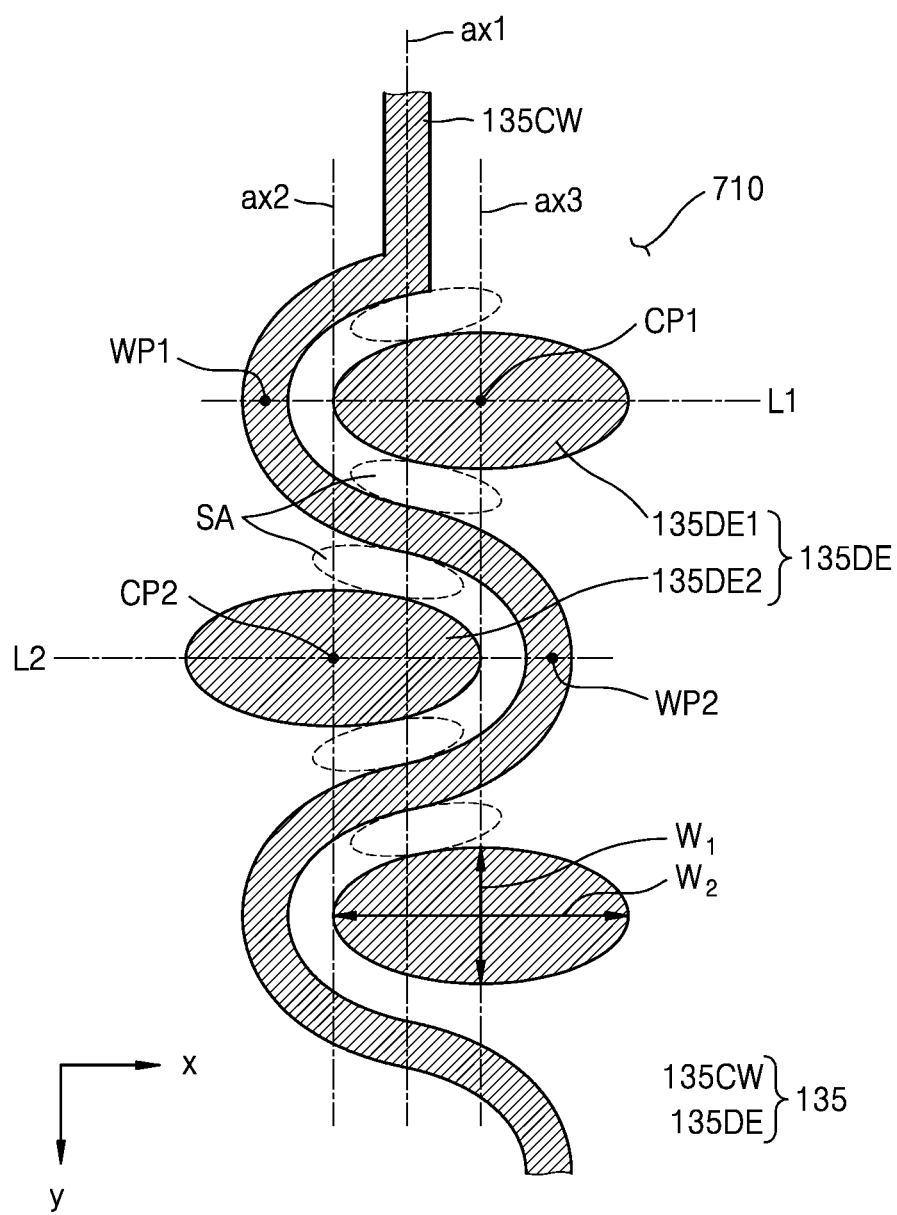

FIGS. 6 to 8 are enlarged plan views schematically showing embodiments of a portion of a display apparatus 1.

Referring to FIGS. 6 to 8, the first conductive layer 135 extends from the first area 1A (refer to FIG. 2) to the second area 2A, through the bending area BA, along the direction y. The first conductive layer 135 may include the connection wire 135CW electrically connected to the pad portion 40 and configured to transmit a data signal Dm to each pixel P, and the plurality of dummy patterns 135DE corresponding to first and second corner portions C1 and C2 (e.g., first and second curved portions) of the connection wire 135CW.

The connection wire 135CW may have a continuous shape along a length of the connection wire 135CW, in which the first corner portion C1 curved in a first direction (e.g., a direction −x) with respect to a first axis ax1 perpendicular to the bending axis BAX (refer to FIG. 1), and the second corner portion C2 curved in a second direction (e.g., the direction +x) with respect to the first axis ax1 which is opposite to the first direction, are alternately arranged along the length of the connection wire 135CW and connected to each other.

In an embodiment, the connection wire 135CW may have a shape in which S-shapes are repeatedly connected. An arc of the curved portions of the connection wire 135CW may correspond to a portion of a shape, such as a circle, an ellipse, etc. In an embodiment, for example, as shown in FIG. 6, the first corner portion C1 may be arranged along an arc on one side (e.g., first side of the first axis ax1) of a first circle E1 (e.g., first curved shape) having a center on the first axis ax1, and the second corner portion C2 may be arranged along an arc on the other side (e.g., second side of the first axis ax1) of a second circle E2 (e.g., second curved shape) having a center on the first axis ax1 and adjacent to the first circle E1 along the first axis ax1. In FIG. 6, the first circle E1 and the second circle E2 are shown only as having an elliptical shape of the same size, but the disclosure is not limited thereto. The first circle E1 and the second circle E2 may have various modifications such as a circular shape or a distorted circular shape, and the first circle E1 and the second circle E2 may have different planar sizes from each other.

In another embodiment, the connection wire 135CW may have a shape in which Z-shapes or zigzag shapes are repeatedly connected. In an embodiment, for example, as shown in FIG. 7, the first corner portion C1 may be arranged along sides on one side of a first rhombus D1 having a center on the first axis ax1, and the second corner portion C2 may be arranged along sides on the other side of a second rhombus D2 having a center on the first axis ax1. In an embodiment, the first rhombus D1 and the second rhombus D2 may be chamfered, and inner and outer edges of each of the first and second corner portions C1 and C2 arranged along the first rhombus D1 and the second rhombus D2 may be formed in a round curve shape.

The plurality of dummy patterns 135DE may be arranged on an inner side of a curve of the first corner portion C1 and an inner side of a curve of the second corner portion C2, respectively. In an embodiment, for example, the connection wire 135CW may surround or extend along at least a portion of each of the dummy patterns 135DE. The connection wire 135CW and the dummy patterns 135DE may be arranged spaced apart from each other, and thus, the connection wire 135CW and the dummy patterns 135DE may be electrically disconnected each other. Accordingly, a short due to the dummy patterns 135DE may be prevented, and cracks may be prevented from starting at a contact point between the connection wire 135CW and the dummy patterns 135DE and being propagated.

In an embodiment, a first center CP1 of a first dummy pattern 135DE1 may be spaced apart from a first curve point WP1 at which the connection wire 135CW has a tangent line parallel to the first axis ax1 by a distance in the second direction (e.g., the direction +x), and a second center CP2 of a second dummy pattern 135DE2 may be spaced apart from a second curve point WP2 at which the connection wire 135CW has a tangent line parallel to the first axis ax1 by a distance in the first direction (e.g., the direction −x). The first center CP1 of the first dummy pattern 135DE1 may be aligned with the first curve point WP1 of the connection wire 135CW along a first line L1 parallel to the bending axis BAX. Similarly, the second center CP2 of the second dummy pattern 135DE2 may be aligned with the second curve point WP2 along a second line L2 parallel to the bending axis BAX. A curve point of the connection wire 135CW may also be considered an undulation point (e.g., turning point) where a direction of the connection wire 135CW (e.g., a respective corner portion) changes direction. Referring to FIGS. 6 and 7, each of the plurality of curved portions has an undulation point, each of the plurality of dummy portions which is inside a corresponding curved portion among the plurality of curved portions, has a center along the direction x, and the center of each of the plurality of dummy patterns is spaced apart from the undulation point of the corresponding curved portion, along the direction x.

As shown in FIGS. 6 and 7, the plurality of dummy patterns 135DE may be spaced apart from each other by a distance along the first axis ax1 and arranged in a straight line (e.g., respective centers being aligned with each other).

In another embodiment, as shown in FIG. 8, the plurality of dummy patterns 135DE may include the first dummy pattern 135DE1 arranged on an inner side of a curve of the first corner portion C1 and the second dummy pattern 135DE2 arranged on an inner side of a curve of the second corner portion C2, and a center of the first dummy pattern 135DE1 and a center of the second dummy pattern 135DE2 may be misaligned with each other with respect to the first axis ax1. In an embodiment, for example, a center of the first dummy pattern 135DE1 may be on a third axis ax3 spaced apart from the first axis ax1 in the second direction (e.g., the direction +x), and a center of the second dummy pattern 135DE2 may be on a second axis ax2 spaced apart from the first axis ax1 in the first direction (e.g., the direction −x). The disclosure is not limited thereto, and a center of the first dummy pattern 135DE1 may be on the second axis ax2 spaced apart from the first axis ax1 in the first direction (e.g., the direction −x), and a center of the second dummy pattern 135DE2 may be on the third axis ax3 spaced apart from the first axis ax1 in the second direction (e.g., the direction +x).

When the substrate 100 is bent, the connection wire 135CW is subjected to tensile stress in the direction y which crosses the bending axis BAX, such as being perpendicular to the bending axis BAX, and the stress may be concentrated on peripheral portions of the first curve point WP1 and the second curve point WP2 at which a tangent line of the connection wire 135CW is parallel to the first axis ax1. By arranging the dummy patterns 135DE having a higher elastic modulus than the substrate 100 and the lower organic material layer 710, in correspondence with the first curve point WP1 and the second curve point WP2, the stress concentrated on the first curve point WP1 and the second curve point WP2 may be distributed. Accordingly, the connection wire 135CW may be prevented from being short-circuited by cracks starting from the peripheral portions of the first curve point WP1 and the second curve point WP2.

In a plan view, the plurality of dummy patterns 135DE may have various modifications such as a circular shape, a rhombus shape, a chamfered quadrilateral shape, a chamfered rhombus shape, an elliptical shape, or a distorted circular shape. Referring to FIG. 8, for example, in each of the dummy patterns 135DE, a first width w1 in a direction perpendicular to the bending axis BAX may be less than a second width w2 in a direction parallel to the bending axis BAX. The first width w1 may define a minor dimension of the various dummy patterns, while the second width w2 may define a major dimension of the various dummy patterns.

Accordingly, in the connection wire 135CW surrounding or extending along at least a portion of each of the dummy patterns 135DE, a proportion of a portion having a component in a direction (e.g., the direction ±x) parallel to the bending axis BAX may be increased. The dummy patterns 135DE have a higher elastic modulus than the substrate 100 and the upper and lower organic material layers 720 and 710. Thus, when the substrate 100 is bent, spaces SA (or gaps) between the dummy patterns 135DE and the connection wire 135CW are tensioned so that tensile stress may be distributed like a spring.

Although direct stress due to bending is not applied to a portion of the first conductive layer 135 that does not overlap the bending area BA, stress generated in a portion of the first conductive layer 135 which does overlap the bending area BA may be transferred along the first conductive layer 135 to apply indirect stress thereto. Accordingly, to prevent damage to the first conductive layer 135 due to the indirect stress, the first and second corner portions C1 and C2 and the dummy patterns 135DE are extended further than an outer edge of the lower organic material layer 710 and onto the inorganic insulating layer IOL. Thus, the first conductive layer 135 may be strong enough not to be damaged due to bending at the bending area BA. That is, in the connection wire 135CW having the first and second corner portions C1 and C2, a first end of the connection wire 135CW at a center of the first area 1A and a second end which is opposite to the first end at the second area 2A, may each be arranged on the inorganic insulating layer IOL and spaced apart from the lower organic material layer 710.

The plurality of dummy patterns 135DE may include the same material as that of the connection wire 135CW. That is, the connection wire 135CW and the dummy patterns 135DE may include the same material as that of the electrode layer 120. the connection wire 135CW, the dummy patterns 135DE, and the electrode layer 120 may be formed by the same process, such as to be respective patterns of a same material layer on the substrate 100.

Figure 9A:
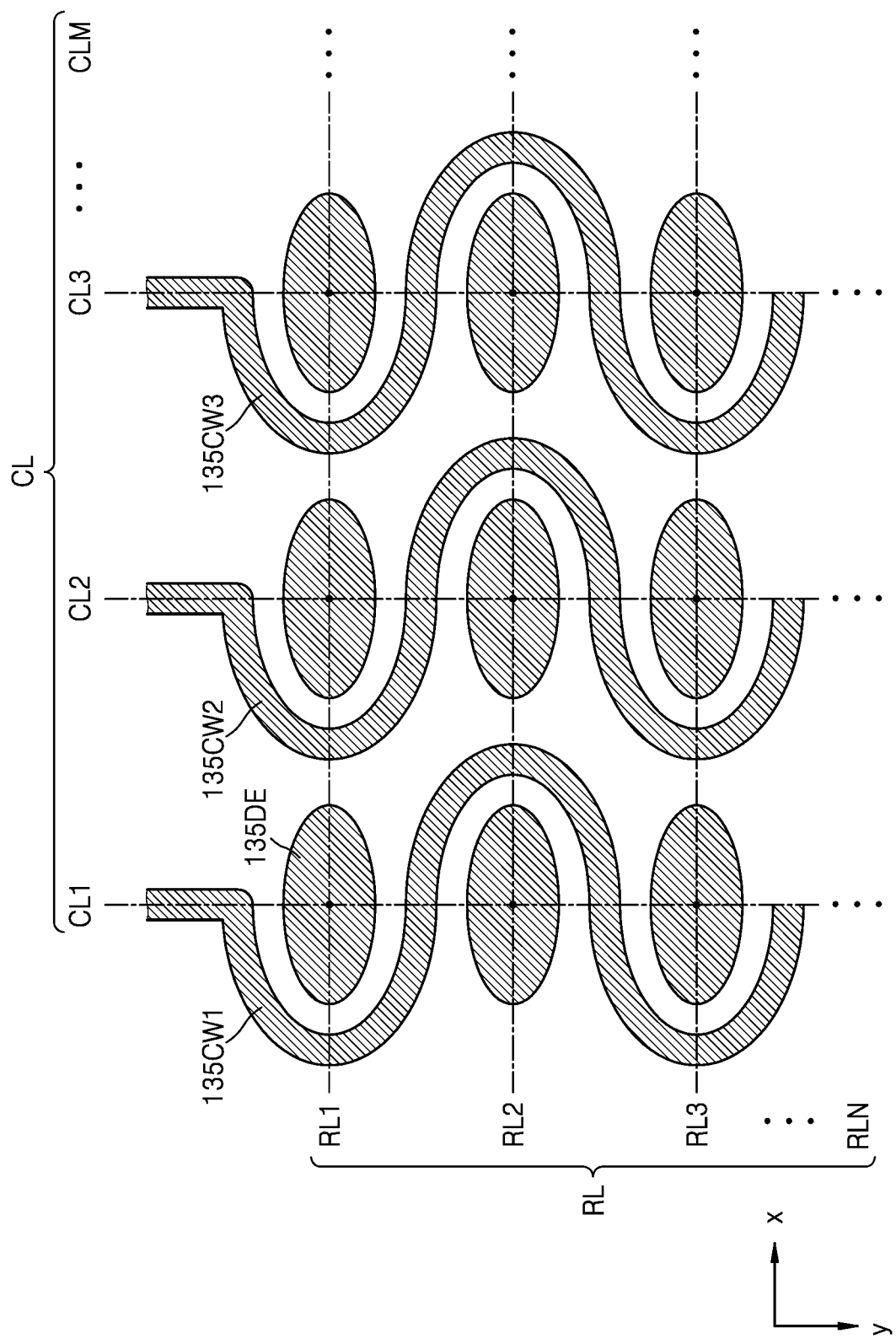
FIGS. 9A and 9B are enlarged plan views schematically showing an embodiment of a region III of FIG. 2.
Figure 9B:
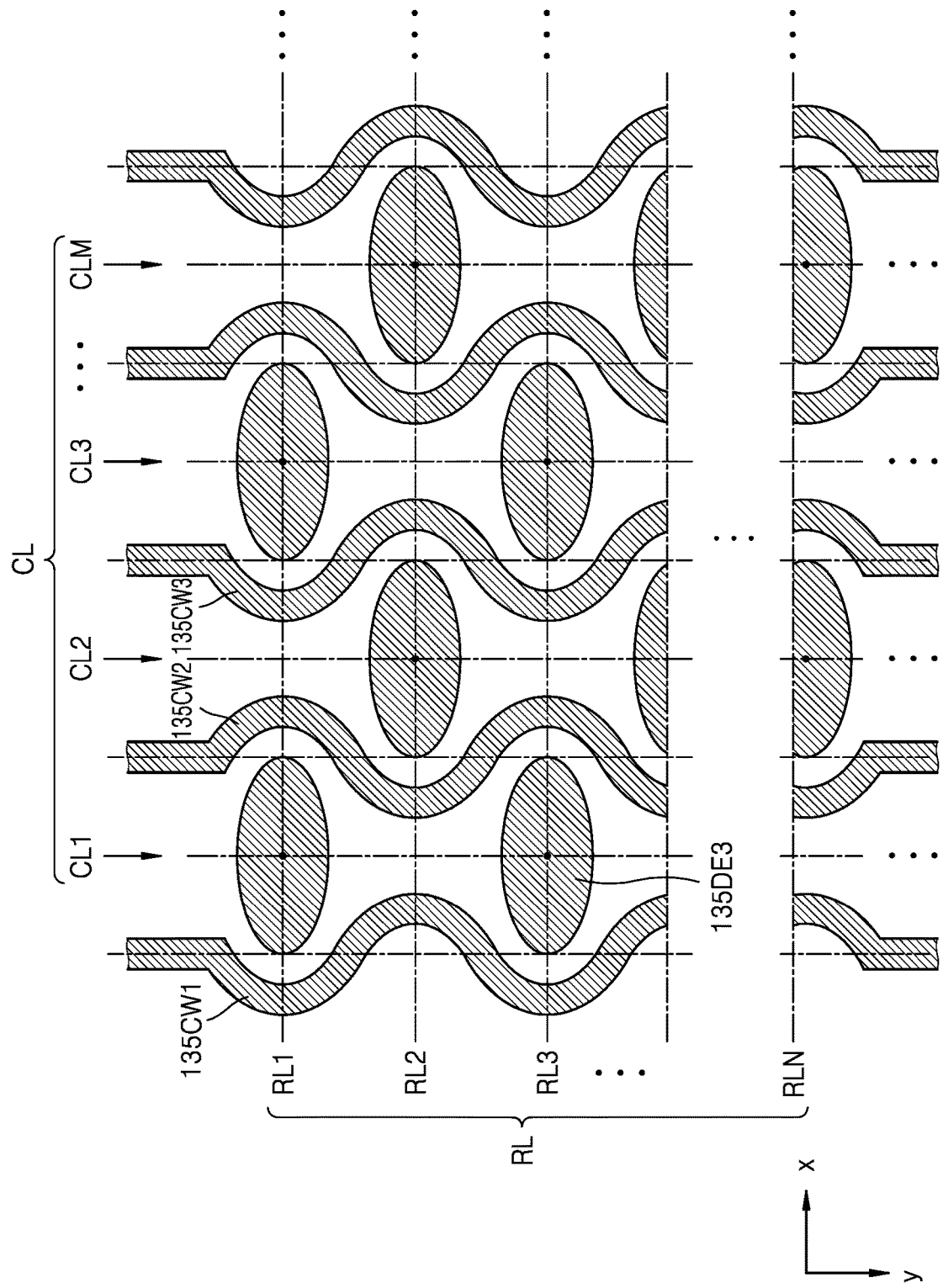

FIGS. 9A and 9B are enlarged plan views schematically showing embodiments of a region III of FIG. 2.

Referring to FIG. 9A, the connection wire 135CW may be provided in plural including a plurality of connection wires 135CW. The plurality of connection wires 135CW may be spaced apart from each other by a distance along the direction x and may be arranged along column lines CL extending in the direction y. Curve points of corner portions of the plurality of connection wires 135CW may be spaced apart from each other by a distance along the direction y and may be arranged along row lines RL extending in the direction x. A first connection wire 135CW1 may have a corner portion curved in the first direction (e.g., the direction −x) at a first row line RL1, may have a corner portion curved in the second direction (e.g., the direction +x) at a second row line RL2, and may have a continuous shape in which corner portions having different curved directions are alternately connected along a first column line CL1. Like the first connection wire 135CW1, a second connection wire 135CW2 may have a corner portion curved in the first direction (e.g., the direction −x) at the first row line RL1, may have a corner portion curved in the second direction (e.g., the direction +x) at the second row line RL2, and may have a continuous shape in which corner portions having different curved directions are alternately connected along a second column line CL2.

Although FIG. 9A shows corner portions of the connection wires 135CW curved in the same direction at the same row line RL, the disclosure is not limited thereto, and corner portions of adjacent connection wires 135CW may be curved in different directions from each other at the same row line RL.

Each of the dummy patterns 135DE may be arranged on an inner side of a curve of each connection wire 135CW, and centers of the dummy patterns 135DE may be arranged in a straight line along a central axis of the connection wire 135CW. Accordingly, the dummy patterns 135DE may be arranged in a grid at intersection points where the row lines RL and the column lines CL cross each other. Such an arrangement of the dummy patterns 135DE may be repeated until an M-th column line CLM and an N-th row line RLN.

Referring to FIG. 9B, while the dummy patterns 135DE are arranged in a grid at intersection points where the row lines RL and the column lines CL cross each other, the dummy patterns 135DE arranged along the first row line RL1 and the dummy patterns 135DE arranged along the second row line RL2 (e.g., different dummy pattern rows) may be misaligned with each other in a direction parallel to the central axis of the connection wire 135CW. In an embodiment, for example, odd rows of the dummy patterns 135DE arranged at intersection points where the first row line RL1 and odd-order column lines CL such as the first column line CL1 and a third column line CL3 cross each other, even rows of the dummy patterns 135DE may be arranged at intersection points where the second row line RL2 and even-order column lines CL such as the second column line CL2 and a fourth column line CL4 cross each other, and such an arrangement of the odd and even rows of the dummy patterns 135DE may be repeated until the N-th row line RLN.

Adjacent connection wires 135CW along the direction x may share a third dummy pattern 135DE3 arranged between the two adjacent connection wires 135CW. In an embodiment, for example, the first connection wire 135CW1 may have a corner portion curved in the first direction (e.g., the direction −x) at a third row line RL3, the second connection wire 135CW2 may have a corner portion curved in the second direction (e.g., the direction +x) at the third row line RL3, and the first connection wire 135CW1 and the second connection wire 135CW2 may surround a portion of the same third dummy pattern 135DE3. The first connection wire 135CW1 and the second connection wire 135CW2 adjacent to the first connection wire 135CW1 may be symmetrical with respect to the first column line CL1. Accordingly, the second connection wire 135CW2 may share the dummy patterns 135DE arranged along the first column line CL1 with the first connection wire 135CW1, and the second connection wire 135CW2 may share the dummy patterns 135DE arranged along the second column line CL2 with a third connection wire 135CW3.

Figure 10:
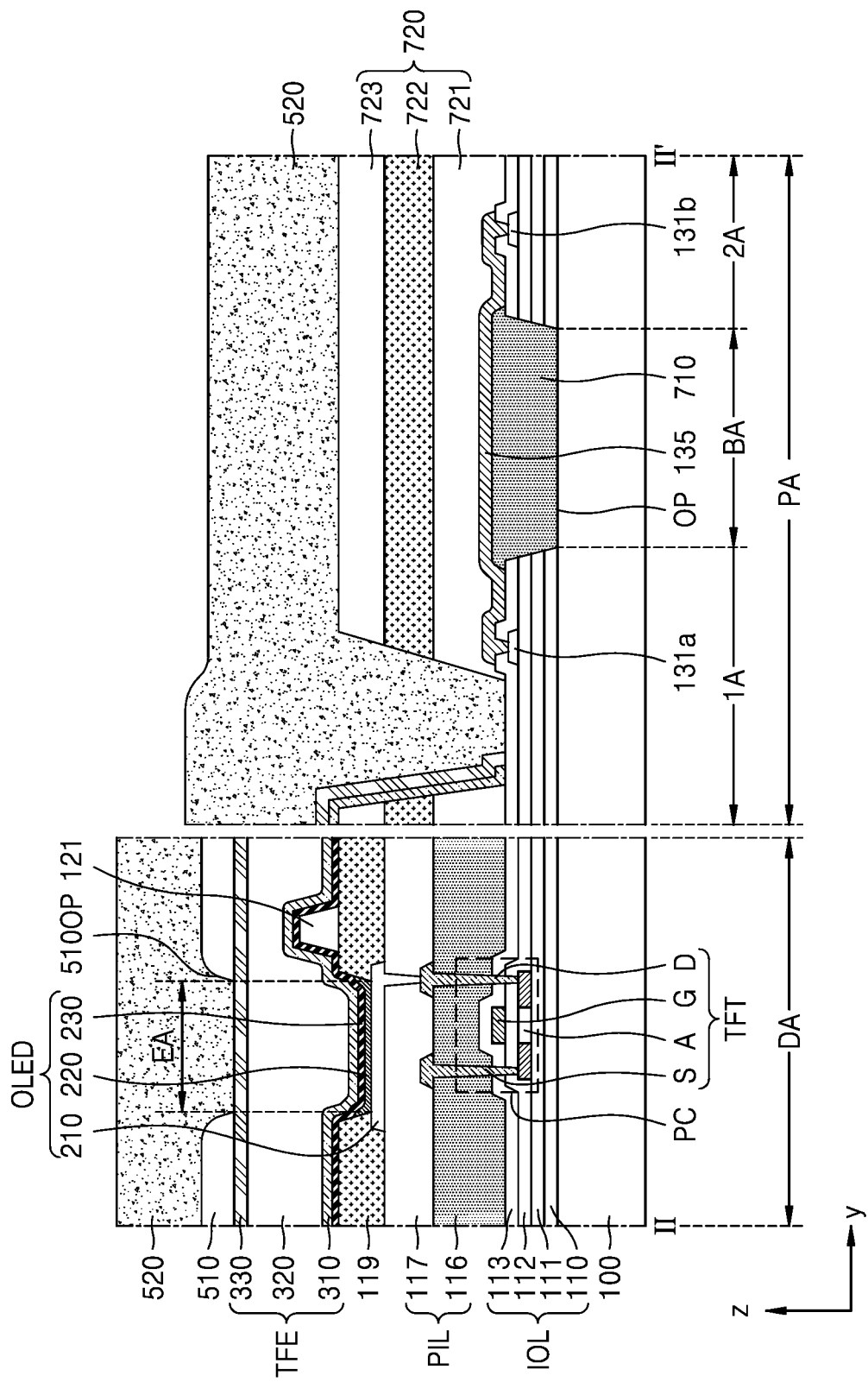
FIG. 10 is a schematic cross-sectional view of the display apparatus of FIG. 2, taken along line II-II' of FIG. 2.

FIG. 10 is a schematic cross-sectional view of an embodiment of the display apparatus 1 of FIG. 2, taken along line II-II' of FIG. 2.

In FIG. 10, for convenience of description, the input sensing layer TU (refer to FIGS. 3A and 3B), the anti-reflection layer PU, and the window layer WU are omitted, and the display layer DU and the optical function layer OU are shown.

Referring to FIG. 10, the display apparatus 1 may include a first optical function layer 510 and a second optical function layer 520 each arranged above the organic light-emitting diode OLED.

An opening pattern 5100P may be formed in the first optical function layer 510 to correspond to an emission area EA. In an embodiment, a width of the opening pattern 5100P may be greater than a width of the emission area EA in the same direction along a plane (e.g., along the substrate 100). The opening pattern 5100P may be arranged in an out-coupling direction of a pixel P to enhance straightness of light of emitted from the emission area EA, thereby improving out-coupling efficiency.

To further improve the out-coupling efficiency described above, the second optical function layer 520 having a refractive index higher that of the first optical function layer 510 may be further arranged on the first optical function layer 510. The first optical function layer 510 may include an insulating material having a first refractive index, and the second optical function layer 520 may include an insulating material having a second refractive index.

The first refractive index of the first optical function layer 510 may be about 1.3 to about 1.6. In an embodiment, the first refractive index of the first optical function layer 510 may be about 1.4 to about 1.55. The first optical function layer 510 may include, for example, ethylhexyl acrylate, pentafluoropropyl acrylate, poly(ethylene glycol) dimethacrylate, or ethylene glycol dimethacrylate. In an embodiment, the first optical function layer 510 may include an acryl-based organic material having a refractive index of about 1.5. In addition, the first optical function layer 510 may include a material of the organic encapsulation layer 320 of the thin film encapsulation layer TFE. In an embodiment, the first optical function layer 510 may include an epoxy-based organic material, and in some cases, may also include a photocurable material.

The second optical function layer 520 may be a planarization insulating layer having the second refractive index. The second refractive index of the second optical function layer 520 may be about 1.65 to about 1.85. The second optical function layer 520 may include, for example, polydiarylsiloxane, methyltrimethoxysilane, or tetramethoxysilane. In an embodiment, the second optical function layer 520 may include an acryl-based and/or siloxane-based organic material having a refractive index of about 1.6. In some embodiments, the second optical function layer 520 may include dispersed particles for a high refractive index. Metal oxide particles, for example, zinc oxide (ZnOx), titanium oxide ($TiO_2$), zirconium oxide ($ZrO_2$), barium titanate ($BaTiO_3$), etc. may be dispersed in the second optical function layer 520.

The first optical function layer 510 and the second optical function layer 520 are arranged in the display area DA, may cover an entirety of the display area DA and may extend from the display area DA to the peripheral area PA. As the second optical function layer 520 extends to the peripheral area PA through the bending area BA, an upper surface of the second optical function layer 520 may be substantially flat at a boundary between the display area DA and the peripheral area PA. Accordingly, by sufficiently extending the second optical function layer 520 from the display area DA to the peripheral area PA, an upper surface of the second optical function layer 520 is provided substantially flat at the boundary between the display area DA and the peripheral area PA so that a difference in thickness of the second optical function layer 520 may be reduced. Thus, stains may be effectively prevented from being recognized at the boundary between the display area DA and the peripheral area PA.

As the second optical function layer 520 extends to the peripheral area PA, through the bending area BA, when the bending area BA is sufficiently covered, thicknesses, moduli, etc. of the upper organic material layer 720 together with the second optical function layer 520 may be adjusted to serve as a bending protection layer.

Figure 11:
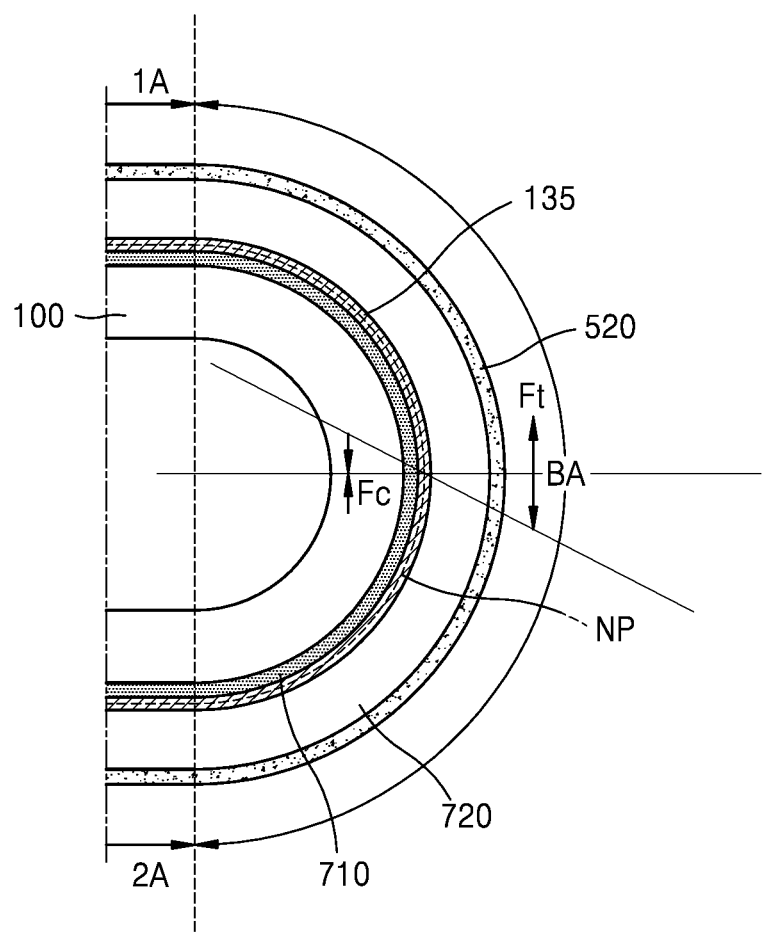
FIG. 11 is a schematic cross-sectional view of an embodiment of a portion of a display apparatus.

FIG. 11 is a schematic cross-sectional view of an embodiment of an end portion of a display apparatus 1 which is bent.

Referring to FIG. 11, when the display apparatus 1 including the substrate 100 is bent, a stress neutral plane NP exists in a stack of layers including the substrate 100. When the substrate 100 is bent, a compressive stress Fc may be applied to the inside of the neutral plane NP within the stack, and a tensile stress Ft may be applied to the outside of the neutral plane NP within the stack. The neutral plane NP may be at a position where the compressive stress Fc and the tensile stress Ft are in equilibrium. When the first conductive layer 135 does not correspond to the neutral plane NP, the compressive stress Fc, the tensile stress Ft, or the like may be excessively applied to the first conductive layer 135. However, by adjusting thicknesses, moduli, etc. of the upper organic material layer 720 and the second optical function layer 520 arranged on the first conductive layer 135, a position of the neutral plane NP may be adjusted in a stack including all of the substrate 100, the lower organic material layer 710, the first conductive layer 135, the upper organic material layer 720, and the second optical function layer 520. Accordingly, by placing the neutral plane NP near or at the first conductive layer 135, the tensile stress Ft applied to the first conductive layer 135 may be reduced, or the compressive stress Fc may be applied to the first conductive layer 135.

As a comparative example, it may be assumed that a comparative display apparatus includes a bending protection layer covering a bending area. In this case, by using the bending protection layer, a position of a neutral plane may be adjusted and a conventional first conductive layer may be protected. However, due to a thickness of the bending protection layer reaching about 90 micrometers (μm), there is a problem in that a bending diameter increases and dead space at the bottom of the conventional display apparatus increases. In addition, there are not only problems caused by ununiformly applying the bending protection layer, such as formation of cracks due to the bending protection layer, generation of bubbles, and exfoliation of the bending protection layer, but also a problem such as the need of a separate process for forming the bending protection layer. In one or more embodiment of the display apparatus 1, by using processes of forming the pixel circuit PC and the optical function layer OU, a position of the neutral plane NP may be adjusted, and a bending protection layer may be omitted. Accordingly, dead space at the bottom of the display apparatus 1 may be reduced, and the above-described problems that may occur due to the bending protection layer may be solved.

According to one or more of the embodiments described above, a display apparatus 1 in which a bending area BA has improved cracks in wiring may be implemented. However, the disclosure is not limited by such an effect.

It should be understood that embodiments described herein should be considered in a descriptive sense only and not for purposes of limitation. Descriptions of features within each embodiment should typically be considered as available for other similar features in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
    a substrate comprising a first area, a second area, and a bending area between the first area and the second area, the substrate being bendable around a bending axis;
    an inorganic insulating layer arranged on the substrate and comprising an opening portion corresponding to the bending area;
    a lower organic material layer filling the opening portion; and
    a conductive layer extending from the first area to the second area through the bending area and arranged on the lower organic material layer, the conductive layer comprises:
    a connection wire comprising a plurality of curved portions including a first corner portion curved at a first side of a first axis crossing the bending axis and a second corner portion curved at a second side of the first axis which is opposite to the first side; and
    a plurality of dummy patterns arranged respectively inside of the plurality of curved portions.

2. The display apparatus of claim 1, wherein the connection wire extends along a portion of each of the plurality of dummy patterns.

3. The display apparatus of claim 2, wherein the connection wire is disconnected from the plurality of dummy patterns.

4. The display apparatus of claim 1, wherein a first end of the connection wire in a direction toward a center of the first area and a second end of the connection wire in a direction from the first area to the second area are on the inorganic insulating layer.

5. The display apparatus of claim 1, wherein the connection wire comprises a plurality of curve points at which a tangent line is parallel to the first axis,
    wherein a center of each of the plurality of dummy patterns is spaced apart from each of the plurality of curve points by a certain distance.

6. The display apparatus of claim 5, wherein the center of each of the plurality of dummy patterns is on the first axis of the connection wire.

7. The display apparatus of claim 5, wherein
    the plurality of dummy patterns comprises a first dummy pattern and a second dummy pattern inside of the first curved portion and the second curved portion, respectively, and
    the center of the first dummy pattern and the center of the second dummy pattern are spaced apart from each other along a direction crossing the first axis.

8. The display apparatus of claim 1, wherein each of the plurality of dummy patterns has a first width in a direction perpendicular to the bending axis and a second width in a direction parallel to the bending axis, and the first width is less than the second width.

9. The display apparatus of claim 8, wherein each of the plurality of dummy patterns has an elliptical shape.

10. The display apparatus of claim 8, wherein each of the plurality of dummy patterns has a rhombus shape.

11. The display apparatus of claim 1, wherein
    the connection wire is provided in plural including a first connection wire and a second connection wire adjacent to each other,
    the plurality of dummy patterns includes a plurality of first dummy patterns between the first connection wire and the second connection wire,
    the first connection wire extends curved along a first side of each of the plurality of first dummy patterns, and
    the second connection wire extends curved along a second side of the plurality of first dummy patterns which is opposite to the first side thereof.

12. The display apparatus of claim 11, wherein
    centers of the first dummy patterns are aligned with each other along a central axis, and
    the first connection wire and the second connection wire are symmetrical with respect to the central axis.

13. The display apparatus of claim 1, further comprising a thin-film transistor arranged in the first area,
    wherein the thin-film transistor comprises a semiconductor layer, a gate electrode corresponding the semiconductor layer, and an electrode layer on the gate electrode, and
    the conductive layer which extends from the first area to the second area, through the bending area, comprises a same material as a material of the electrode layer of the thin-film transistor.

14. The display apparatus of claim 1, further comprising a planarization insulating layer in the first area,
    wherein the planarization insulating layer comprises a first planarization insulating layer and a second planarization insulating layer arranged on the first planarization insulating layer, and
    the lower organic material layer comprises a same material as a material of the first planarization insulating layer.

15. The display apparatus of claim 1, further comprising an upper organic material layer facing the lower organic material layer with the conductive layer therebetween.

16. The display apparatus of claim 15, further comprising a planarization insulating layer arranged in the first area,
    wherein the planarization insulating layer comprises a first planarization insulating layer and a second planarization insulating layer arranged on the first planarization insulating layer, and
    the upper organic material layer comprises a same material as a material of the second planarization insulating layer.

17. The display apparatus of claim 15, further comprising a pixel-defining layer arranged in the first area and defining an emission area through an opening,
    wherein the upper organic material layer which faces the lower organic material layer with the conductive layer therebetween, comprises a same material as a material of the pixel-defining layer which is in the first area.

18. The display apparatus of claim 17, further comprising a spacer on the pixel-defining layer, in the first area,
    wherein the upper organic material layer which faces the lower organic material layer with the conductive layer therebetween, comprises a same material as a material of the spacer which is in the first area.

19. The display apparatus of claim 15, further comprising:
a display element arranged in the first area;
a first optical function layer on the display element and comprising an opening corresponding to the display element; and
a second optical function layer on the first optical function layer and having a refractive index of the second optical function layer is different from a refractive index of the first optical function layer,
wherein the second optical function layer extends from the first area to the second area through the bending area.

20. A display apparatus comprising:
a substrate comprising a first area, a second area, and a bending area between the first area and the second area, the substrate being bendable around a bending axis;
an inorganic insulating layer arranged on the substrate and comprising an opening portion corresponding to the bending area;
a lower organic material layer filling the opening portion;
a connection wire arranged on the lower organic material layer, extending from the first area to the second area through the bending area, and comprising a plurality of curved portions including a first corner portion curved at a first side of a first axis crossing the bending axis and a second corner portion curved at a second side of the first axis which is opposite to the first side; and
a plurality of dummy patterns arranged respectively inside of the plurality of curved portions,
wherein the plurality of dummy patterns comprise a same material as a material of the connection wire.

\* \* \* \* \*